(12) United States Patent
Gross

(10) Patent No.: US 11,892,516 B2
(45) Date of Patent: *Feb. 6, 2024

(54) SYSTEM AND METHOD FOR DETERMINING A STATE OF HEALTH OF A POWER SOURCE OF A PORTABLE DEVICE

(71) Applicant: ESW Holdings, Inc., Austin, TX (US)

(72) Inventor: Amit Gross, Kfar-aba (IL)

(73) Assignee: ESW Holdings, Inc., Austin, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/718,897

(22) Filed: Apr. 12, 2022

(65) Prior Publication Data

US 2022/0236336 A1  Jul. 28, 2022

Related U.S. Application Data

(63) Continuation of application No. 16/909,370, filed on Jun. 23, 2020, now Pat. No. 11,327,120, which is a continuation of application No. 15/654,805, filed on Jul. 20, 2017, now Pat. No. 10,725,113, which is a continuation of application No. 14/187,366, filed on Feb. 24, 2014, now Pat. No. 9,726,730.

(51) Int. Cl.
  *G01R 31/392* (2019.01)
  *G01R 31/3835* (2019.01)

(52) U.S. Cl.
  CPC ....... *G01R 31/392* (2019.01); *G01R 31/3835* (2019.01)

(58) Field of Classification Search
  None
  See application file for complete search history.

(56) References Cited

U.S. PATENT DOCUMENTS

| | | | |
|---|---|---|---|
| 2009/0109046 A1* | 4/2009 | Gielniak | G01R 31/392 340/636.12 |
| 2010/0036626 A1* | 2/2010 | Kang | G01R 31/392 702/63 |
| 2011/0279124 A1* | 11/2011 | Hansen | G01R 1/203 324/429 |
| 2013/0198541 A1* | 8/2013 | Rabii | H04W 52/0261 713/340 |
| 2015/0130273 A1* | 5/2015 | Govindaraj | B60L 50/10 324/548 |

OTHER PUBLICATIONS

Notice of Allowance dated Jan. 12, 2022, filed in U.S. Appl. No. 16/909,370, pp. 1-4.

(Continued)

*Primary Examiner* — Arleen M Vazquez
*Assistant Examiner* — Brandon J Becker

(57) ABSTRACT

A method for determining a State of Health (SoH) of a power source of a portable device involves extracting a start voltage value of an examined power source; activating one or more hardware components of the portable device by a software, to increase the current consumption of the device, identifying a voltage drop rate of the examined power source and comparing a calculated voltage drop rate to pre-calculated threshold values stored on a database of a main server. A system for executing the method is also disclosed.

12 Claims, 3 Drawing Sheets

(56) References Cited

OTHER PUBLICATIONS

Response to Final Office Action dated Jan. 2, 2022, filed in U.S. Appl. No. 16/909,370, p. 1.
Terminal Disclaimer Filed on Nov. 23, 2021, filed in U.S. Appl. No. 16/909,370, pp. 1-2.
Terminal Disclaimer Approved on Nov. 23, 2021, filed Nov. 23, 2021, filed in U.S. Appl. No. 16/909,370, p. 1.
Response to Final Office Action dated Nov. 23, 2021, filed in U.S. Appl. No. 16/909,370, pp. 1-12.
Final Rejection dated Jul. 23, 2021, filed in U.S. Appl. No. 16/909,370, pp. 1-16.
Response to Non-Final Office Action dated Mar. 8, 2021, filed in U.S. Appl. No. 16/909,370, pp. 1-9.
Non-Final Rejection dated Oct. 6, 2020, filed in U.S. Appl. No. 16/909,370, pp. 1-7.

* cited by examiner

SYSTEM AND METHOD FOR DETERMINING A STATE OF HEALTH OF A POWER SOURCE OF A PORTABLE DEVICE

CROSS-REFERENCE TO RELATED APPLICATIONS

This application is a continuation of U.S. patent application Ser. No. 14/187,366, filed Feb. 24, 2014, which is hereby incorporated by reference.

BACKGROUND OF THE INVENTION

Mobile devices are dependent upon their batteries' life time. Approximately 20% of all customer complaints regarding portable devices are battery related. However, 80% of replaced batteries are found to have good State of Health (SoH).

Some known methods and systems for determining a SoH of a battery require long battery inspection terms and provide poor accuracy and reliability.

For example, internal impedance check, also known as Ohm test, has very poor accuracy and often provides different results for the same battery. Furthermore, impedance check is not reliable for Li-ion batteries.

Self-discharge check takes a very long time (e.g., approximately 50 hours for Lithium Ion batteries). Prime check requires approximately 24 hours.

Furthermore, known methods and systems require removing the battery from the device that it powers. However, more and more portable devices have an integral power source, and thus removing the power source from the portable device may damage the device.

Known systems and methods for determining the SoH of a battery require unique testing equipment, are expensive, and require setting for different types of batteries. Another disadvantage of known systems and methods is that adapters are required for each type of battery. User non replaceable batteries, such as iPhone batteries, Nexus batteries and the like, have unique connectors and thus do not have suitable adaptors.

Finally, known testing equipment require routine maintenance which is time consuming and may be expensive.

SUMMARY OF THE INVENTION

The present invention provides a system and method for determining the state of health of a power source of a portable device.

According to some embodiments of the present invention, a method for determining a State of Health (SoH) of a power source of a portable device may comprise extracting at least one device parameter from the portable device, such as power source type; power source design capacity; power source model; portable device model; and manufacturer details.

The method further comprises obtaining a start voltage value of the examined power source and a time stamp indicative of the time the start voltage value is obtained; activating hardware components of the portable device to increase current consumption of the device; identifying at least a first voltage drop relative to said start voltage value; calculating, based on pairs of consecutive voltage drops a voltage change value; comparing the calculated voltage change value of said power source to threshold values stored in a database; and determining the State of Health of the power source based on the comparison of the calculated voltage change value and the threshold values.

According to some embodiments, the method may further comprise identifying at least a second voltage drop relative to the first voltage drop; calculating, based on the second voltage drop and the first voltage drop a second voltage drop rate of the power source; and calculating the voltage change value based on a derivative of the voltage in time.

According to some embodiments, the activating of the hardware comprises activating one or more hardware components of the portable device, selected from a group consisting: a processor of the portable device; a display of the portable device; a flashlight of the portable device; and a Global Positioning System (GPS) of the portable device.

According to some embodiments, the identification of the at least first voltage drop and the at least second voltage drop comprises reading in predefined time intervals, a voltage file of an operation system of the portable device.

The method, according to some embodiments, may further comprise checking that at least one prerequisite is met prior to obtaining the start voltage value. The at least one prerequisite may be selected from a group consisting of: state of charge of the power source; ambient temperature and disconnection of examined power source from a charger.

According to some embodiments, the ambient temperature may be between 10-35 Celsius degrees. The state of charge may be in the range of 30%-80%.

According to some embodiments, at least one of the threshold values may be calculated based on at least one of: a mean voltage drop rate and standard deviation of a first cluster of power sources known to have a good state of health; a mean voltage drop rate and standard deviation of a second cluster of power sources known to have a bad state of health; and clustering algorithm. According to some embodiments, the clustering algorithm may be a static clustering algorithm. According to other embodiments, the clustering algorithm may be a dynamic clustering algorithm (i.e., a clustering algorithm that continuously updates the clusters based on new observations).

According to some embodiments at least another of the threshold values equals the first threshold value multiplied by a coefficient. According to some embodiments, the coefficient may be in the range of 1.251.90. According to other embodiments, the coefficient value may be 1.61.

A system for determining a SoH of a power source of a portable device is also provided. According to embodiments of the present invention, the system may comprise at least one portable device; and a main server. The portable device may comprise: a processor; a non-transitory computer readable memory; a power source; and a communication unit. The main server may comprise a main processor; a database; and a main communication unit.

According to some embodiments, the at least one portable device and the main server are in active communication over a network; and the memory comprises a software adapted to activate a plurality of hardware components of the portable device, and the processor is adapted to calculate at least one voltage drop rate and communicate the calculated voltage drop rate to the main server over the network.

According to some embodiments, the main processor is adapted to compare the received calculated voltage drop rate to threshold values stored in the database and return to the portable device a State of Health of said power source, based on the comparison.

According to some embodiments, the portable device may further comprise a display adapted to display the SoH of the power source.

According to some embodiments, the portable device may further comprise a clock. According to some embodiments, the portable device may further comprise a temperature sensor.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

Figure 1:
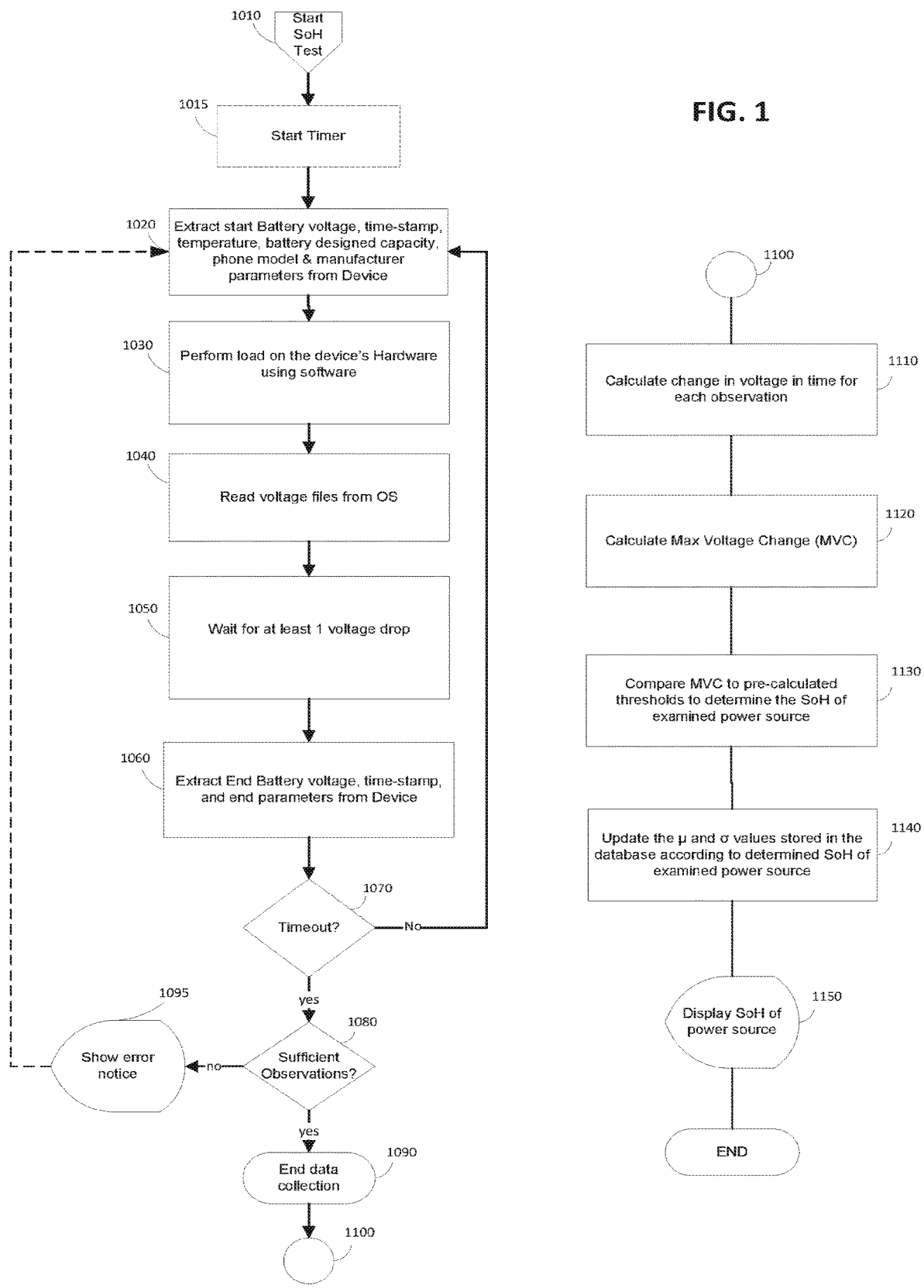
FIG. 1 is a flowchart of a method for determining the State of Health (SoH) of a portable power source, such as a battery, according to one embodiment of the present invention.

It will be appreciated that, for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

DETAILED DESCRIPTION OF THE INVENTION

In the following detailed description, numerous specific details are set forth in order to provide a thorough understanding of the invention. However, it will be understood by those skilled in the art that the present invention may be practiced without these specific details. In other instances, well-known methods, procedures, and components have not been described in detail so as not to obscure the present invention.

Referring to FIG. 1, a flowchart of a method for determining the state of health of a portable power source, such as a battery, according to one embodiment of the present invention is presented.

According to embodiments of the present invention, when a State of Health (SoH) test is initiated (block 1010), a timer may be started (block 1015) in order to indicate the duration of the SoH test. It should be appreciated, however, that this stage may not be required in all embodiments of the present invention, and that the test duration may be obtained from an internal clock of the device or from a network such as the internet.

After the timer is started, different parameters may be extracted from the portable power source (e.g., a battery) of the examined portable device (block 1020). For example, a start voltage of the portable device battery may be extracted and recorded in a memory of the portable device. According to some embodiments, the start voltage may be recorded in a memory together with a time stamp indicating the time of extracting of the start voltage.

According to some embodiments, one or more additional parameters may be extracted and recorded on a memory (e.g., a non-transitory computer readable medium such as a memory card of the portable device), such as ambient temperature at the beginning of the test; SoC of power source at the beginning of the test; design capacity of the power source; portable device type (e.g., smart phone, tablet computer, smart watch, etc.); number of cores of Central Processing Unit (CPU) in the portable device; consumption of current of portable device; portable device's model and manufacturer parameters. It should be appreciated by those skilled in the art that other or additional parameters may be obtained from the portable device. It should be further realized that the extracted parameters may be monitored and recorded by the Operation System (OS) of the device as part of its regular operation. However, according to some embodiments, some of the extracted parameters may not be routinely extracted and recorded by the OS and may be extracted only for the purpose of the SoH test.

After the required start parameters have been extracted and recorded, the portable device's hardware may be electrically loaded (block 1030) by activating software programs installed on the portable device characterized by relatively high current consumption, in order to maximize current consumption during the time of the SoH test. According to an embodiment of the present invention, software may be run on all cores of the CPU in order to load the portable device. According to some embodiments, the software may be byte oriented software, such as MD5 Hash or other encryption software. It should be appreciated by those skilled in the art that other software may be used.

According to some embodiments, the loading stage (block 1030) may precede the parameters extracting stage (block 1020). According to some embodiments, the loading stage may continuously proceed during the entire process. According to other embodiments, the loading stage may be non-continuous.

According to some embodiments, in addition to or instead of loading the CPU of the portable device, other hardware may be operated in order to obtain high load of the power source. For example, while running byte oriented software on all cores of the CPU, the screen of the portable device may be illuminated in white light with a high brightness level. In another example, a Global Positioning System (GPS) may be activated in conjunction with or instead of one or more of other hardware components of the portable device, in order to load the device. According to yet another example, the flashlight of the device may be activated in conjunction with or instead of other hardware components in order to load the portable device. It should be appreciated that other or additional hardware elements of the portable device may be operated in order to load the device.

During loading of the device, voltage files may be read from the Operation System (OS) running on the device (block 1040). According to some embodiments of the present invention, reading of voltage files may be conducted every predefined time interval, such as every 500 milliseconds, until at least one voltage drop is identified (block 1050). It should be appreciated that a voltage drop may be a decrease in the voltage of the power source with respect to a previous voltage reading.

According to some embodiments, voltage drops may be identified by comparing consecutive readings of voltage files from the OS of the device, A voltage drop would be identified between two consecutive readings of voltage files, when the voltage in earlier reading is higher than the reading in the later reading.

According to some embodiments, a baseline for voltage drop check may be set as the voltage of the power source at the time of the first identified voltage drop. After the voltage baseline has been set, at least another voltage drop is awaited (block 1050). According to embodiments of the present invention, each voltage level at each voltage drop is recorded. In addition, a time stamp may be assigned to each voltage level at each voltage drop (block 1060).

According to some embodiments, the start voltage extracted at the properties extraction stage (block 1020) may be used as the baseline for determining voltage drop. Thus, it should be appreciated that a single voltage drop may be sufficient in order to determine the SoH of an examined battery or other power source.

According to some embodiments of the present invention, additional test of end parameters may be obtained and stored (block 1060). For example, test of end parameters may comprise end voltage of power source; a time stamp; ambient temperature at the end of the test; total current consumption; and other parameters from the portable device.

After at least one voltage drop has been observed and recorded, and end parameters has been extracted, a check may be conducted to determine whether a predetermined timeout period has elapsed (block 1070) from the beginning of the test. If the preset timeout period has not elapsed, steps 1020 to 1060 may be repeated to obtain additional test results and thus improve the accuracy of the SoH determination.

When the preset timeout period elapses, the data collection stage ends (block 1090). It should be appreciated that the data collected (i.e., observations of the voltage of the power source and the time of observation) during the test may serve as the raw data for calculation and determination of the SoH of a power source.

According to some embodiments of the present invention, a check of the observations may be conducted to verify that the observed data is sufficient and is informative (block 1080). For example, at this stage a check may be conducted to verify that the identified voltage drop is larger than a predefined threshold. According to some embodiments, a check for identifying abnormal observations may also be conducted at this stage. For example, if an observation shows an increase in the voltage with respect to a previous observation, or with respect to the baseline voltage, such an observation may not be taken into consideration in the determination of the SoH of the power source.

According to some embodiments of the present invention, if the check conducted in block 1080 indicates that the recorded observations are insufficient in order to complete the SoH determination (e.g., insufficient voltage drop during observation or abnormal observation) the test may be repeated. According to some embodiments, an error notice may be displayed on a display of the portable device (block 1095), indicating that an error has occurred, and may allow the user to decide whether to repeat the test or not.

After the data collection stage ends (block 1090), a power source health determination stage begins (block 1100), The power source health determination stage or SoH determination stage comprises, according to some embodiments of the present invention, calculating the voltage change rate for each observation (block 1110). According to some embodiments, the calculation of the voltage change rate may be done by calculating the slope of the voltage drop curve as may be derived from the data obtained for two consecutive observations, for example by calculating a derivative of the voltage in time. It should be realized that, for the first observation, the calculation of the slope of the voltage drop curve is done with respect to the start voltage of the power source extracted at block 1020 or with respect to the baseline voltage set after the observation of a first voltage drop.

After the voltage change in time is calculated for each pair of consecutive observations, a Maximal Voltage Change (MVC) may be calculated (block 1120). It should be appreciated by those skilled in the art that the MVC is the observation with the largest voltage drop in a given time interval.

According to other embodiments, an Average Voltage Change (AVC) may be used. AVC value may be a weighted average of the voltage drop rates calculated in block 1110. According to one embodiment, each voltage drop rate value may be assigned a different weight according to different criteria. For example, as the time that elapsed from the beginning of the test is longer, the voltage drop rate value may get a higher weight.

According to some embodiments of the present invention, all voltage drop rates may receive the same weight in the calculation of the AVC value. It should be further appreciated that, when the weight assigned to the maximal voltage change observation is 1, the AVC value will be equal to the MVC value.

According to some embodiments, the calculated value (i.e., the MVC value and/or the AVC value) may be compared to threshold values stored in a database. The threshold values may be pre-calculated and pre-stored threshold values calculated based on power sources having a known state of health. For example, in a preliminary stage, a large number of reference power sources may be checked in a full cycle SoH test (e.g., approximately 24-48 hours) and each reference power source may be clustered to a cluster according to its measured capacity. For example, if a reference power source has a measured capacity in a full cycle test of less than 80% of the design capacity of the reference power source, this reference power source may be clustered as a bad SoH power source. For each created cluster of reference power sources, the mean voltage drop rate and standard deviation may be calculated and stored in a database.

According to some embodiments of the present invention, a bad SoH threshold and a good SoH threshold may be set according to the following formulas:

$$TH_{bad} = \mu_{bad} - \alpha\sigma_{bad} \tag{1}$$

$$TH_{good} = \mu_{good} + \beta\sigma_{good} \tag{2}$$

Where:

$\mu_{bad}$ is the mean of voltage drop rate for power sources known to have a bad SoH;

$\mu_{good}$ is the mean of voltage drop rate for power sources known to have a good SoH;

$\alpha, \beta$ are power source coefficients;

$\sigma_{bad}$ is the standard deviation of voltage drop rate of power sources known to have a bad SoH; and $\sigma_{good}$ is the standard deviation of voltage drop rate of power sources known to have a good SoH.

According to some embodiments, $\alpha$ and $\beta$ may be selected based on the type of power source, the type of device, the model of the power source or the portable device, the manufacturer of the power source or the device, and/or other parameters such as the tolerance to false results etc. It should be appreciated that $\alpha$ and $\beta$ may be different or may be equal.

According to another embodiment, only a first of the thresholds may be calculated according to one of formulas (1) and (2) above, while the other threshold may be calculated as a function of the first threshold according to the following formula:

$$TH_{bad} = \lambda TH_{good} \tag{3}$$

It should be understood that λ may receive any value equal to or higher than 1. For example, when λ=1, a single threshold is set, and all examined power sources may be determined to be either in good SoH or in bad SoH. When λ is larger than 1, there are two thresholds and a power source may thus be determined to be either in good SoH, in bad SoH or in fair SoH.

Experiments conducted according to embodiments of the present invention show that when λ is in the rage of 1.25-1.90, a reliable determination of the SoH of a power source may be achieved based on the thresholds set according to formulas (1) and (3) above. For example, using λ=1.61 results in a SoH determination over 90% confidence.

After the calculated voltage drop value for an examined power source has been calculated, the MVC or AVC value may be compared to the thresholds for bad SoH (THbad) and for good SoH (THgood) stored in the database to determine the SoH of the examined power source (block 1130). If the calculated value is lower than THbad, then the SoH of the examined power source may be determined to be bad. If the calculated value is higher than THgood, then the SoH of the examined power source may be determined to be good. If the calculated voltage drop value is between THbad and THgood, then the SoH of the examined power source may be determined to be fair.

According to some embodiments, a plurality of thresholds may be calculated using different α, β and λ values. When a plurality of thresholds is used, the SoH of a power source may be determined in a more precise manner. For example, calculating a first threshold using formula (1) with a small a and a second threshold using formula (1) with a larger α, may provide an indication as to how bad is the SoH of the power source. If, for example, the MVC of the power source is higher than the first threshold, than it may be determined that the state of health of the power source is very bad. If the MVC is between the first and second thresholds than the SoH of the power source may be determined to be bad. Similarly, calculating additional thresholds may allow determining the SoH of a power source to be fair-bad SoH, fair-good. SoH, good SoH and so on.

According to other embodiments, clustering algorithms, such as K-means clustering algorithm, 1-R clustering algorithm and the like, may be applied to a large number of reference power sources in order to create different clusters of reference power sources according to their SoH. After creating clusters for different States of Health based on the reference power sources, statistical tests, such as T-test, may be applied to determine how reliable the clusters are, and whether a new clustering process should be applied to update the clusters.

According to some embodiments of the present invention, after the SoH of an examined power source is determined, the data obtained for the examined power source may be used in order to update the μ and σ values stored in the database (block 1140) and to recalculate the thresholds for future use. It should be appreciated that adding the examined power source as a reference power source for future use may change the clustering of other reference power sources. For example, if the examined power source is determined to have a good SoH, the MVC or AVC of the examined power source may be included in the recalculation of $\mu_{good}$ and $\sigma_{good}$ values, and a new $TH_{good}$ may be calculated. It should be appreciated that this stage may not be required, or may be applied only in some cases, while in other cases the MVC or AVC of an examined power source may not be used in order to update the μ and σ values stored in the database or in order to re-cluster the reference power sources.

According to some embodiments, the determined SoH of an examined power source may be presented on display of the portable device (block 1150). According to some embodiments, a recommendation may be presented, such as replace power source, check battery usage, check recharger, and the like, instead or in addition to the indication of the SaI of the examined power source.

Figure 2:
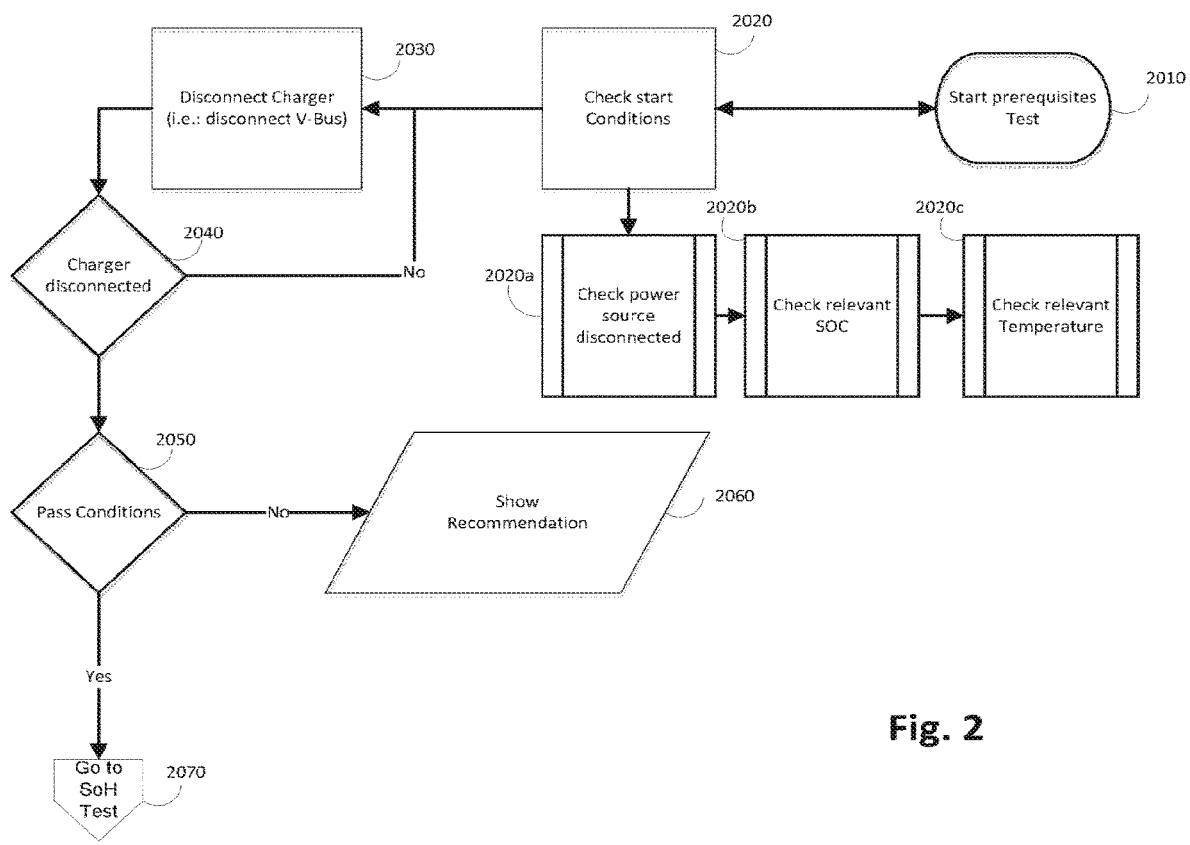
FIG. 2 is a flowchart of a prerequisites check that may precede the method described with reference to FIG. 1 above, according to embodiments of the present invention.

Reference is now made to FIG. 2, which is a flowchart of a prerequisites check that may precede the method described with reference to FIG. 1 above, according to embodiments of the present invention.

According to one embodiment of the present invention, an initial check that the examined battery or other examined power source meets predefined prerequisites may be conducted (block 2020). For example, it may be required that the examined battery be disconnected from an external power source, such as a battery charger, before proceeding to the next stage (block 2020*a*).

An additional or alternative prerequisite may be the ambient conditions in which the examined battery is checked. For example, it may be required that the ambient temperature will be higher than a minimal temperature threshold and/or not lower than a maximal temperature threshold (block 2020*c*), According to one embodiment of the present invention, the minimum temperature threshold may be 10° C. (degrees Celsius), and the maximal temperature threshold may be 35° C. It should be appreciated by those skilled in the art that the maximal and minimal temperature thresholds may change according to the specific type of battery, other ambient conditions, type of battery and the like.

According to some embodiments, the State of Charge (SoC) may also serve as a prerequisite for initiating the battery SoH determination process (block 2020*b*). Typically, the voltage drop curve of a battery, such as a single cell battery, may be divided into a first rapid drop region, a pseudo linear region and a second rapid voltage drop region. Since it may be desirable to conduct the battery's SoH check within the pseudo linear region of the voltage drop curve, a prerequisite of a SoC between a minimal bound and a maximal bound may be determined.

For example, a SoC between 30% and 80% may be determined in order to ensure that the examined battery is in the pseudo linear region of the voltage drop curve. It should be appreciated that SoC bounds may be determined according to the type of battery, the type of device, the age of the battery, etc.

As seen in block 2030 in FIG. 2, a recommendation to disconnect the portable device from external power sources may be presented on a display of the portable device. According to some embodiments, instead or in addition to presenting a recommendation to disconnect the external power source, the v-bus of the portable device may be automatically disconnected and a check whether the portable device is disconnected from an external power source (e.g., a battery charger) is conducted (block 2040).

According to some embodiments of the present invention, after the fact that the examined power source is disconnected from an external power source is verified, a check may be conducted whether other prerequisites are met (block 2050). When one or more of the prerequisites is not met, a recommendation or guidance as to how to meet the unmet prerequisite may be presented (e.g., on a display of the portable device) (block 2060). For example, if the preliminary check indicates that the SoC is below the minimum threshold, an indication may be presented and a recommendation to charge the portable device may be displayed on a display of the device. It should be appreciated that other instructions and guidance may be provided, according to the unmet prerequisite.

When all prerequisites are found to be met, the process may proceed to the SoH determination stage (block 2070).

Figure 3:
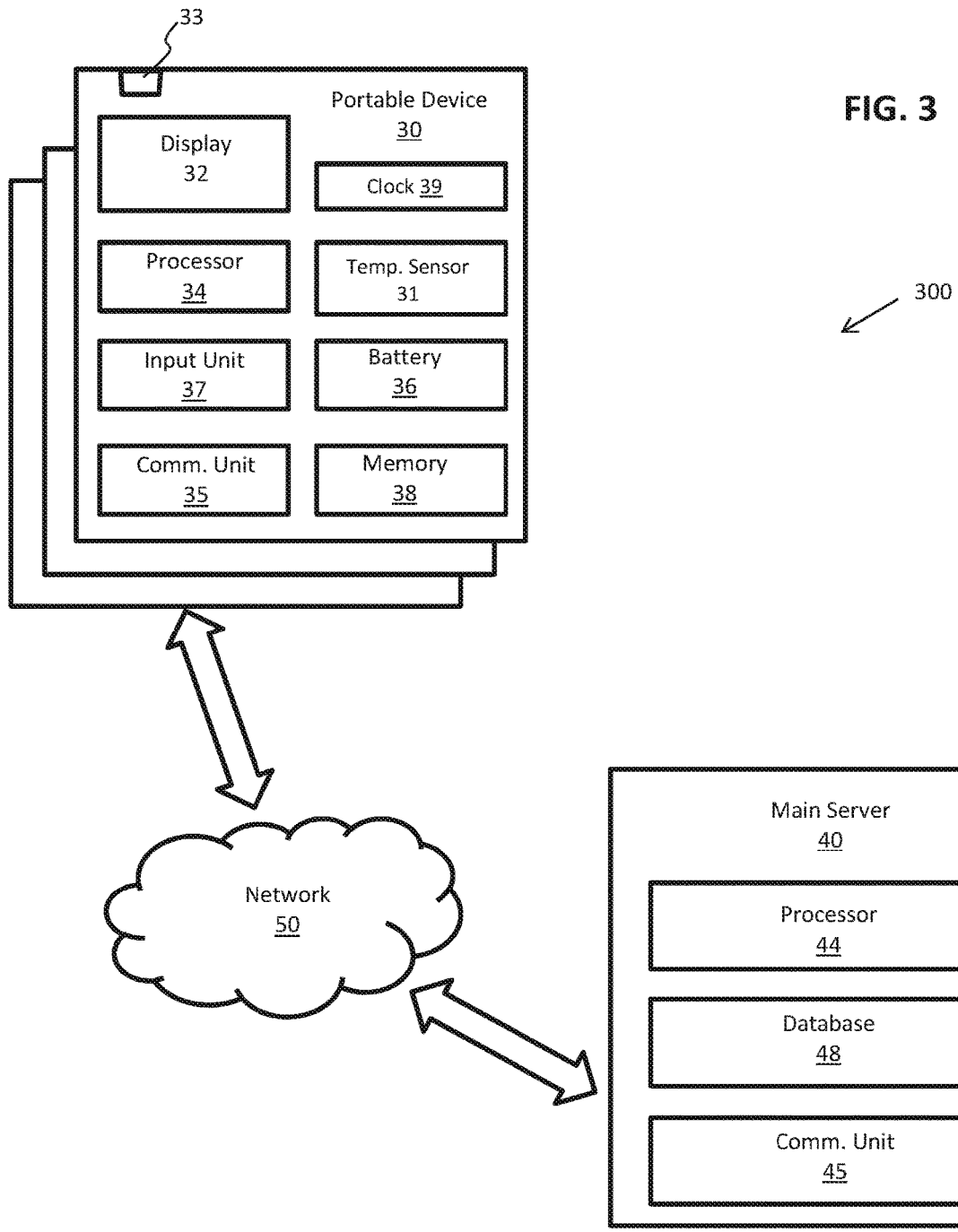
FIG. 3 is a block diagram of a system for determining the SoH of a power source according to embodiments of the present invention.

Reference is now made to FIG. 3, which is a block diagram of a system 300 for determining the SoH of at least one power source, such as battery 36, of at least one portable device 30.

According to some embodiments of the present invention, system 300 may comprise one or more portable devices 30 and at least one main server 40. Main server 40 may be in active communication with one or more portable device 30 over a network 50, such as the internet or a cellular communication network. It should be appreciated that other networks may be used.

According to some embodiments of the present invention, portable device 30 may comprise a display 32, such as a touch screen, a Central Processing Unit (CPU) 34, and a non-transitory computer readable; writable medium, such as memory 38.

According to some embodiments, portable device 30 may further comprise a communication unit 35 for communicating via network 50 with other devices and systems such as main server 40. According to yet other embodiments, portable device 30 may further comprise an input unit 37, such as a keypad, microphone and the like. It would be appreciated that when display 32 is a touch screen, display 32 may be integrated with input unit 37.

In some embodiments of the present invention, portable device 30 may further comprise one or more of: a clock 39; a temperature sensor 31; a Global Positioning System (GPS) unit (not shown); and a power inlet 33 for charging battery 36 from an external power source (not shown). It should be appreciated by those skilled in the art that portable device 30 may comprise other and additional components such as a loudspeakers, camera, and a plurality of hubs and connectors (not shown).

According to some embodiments, when a SoH determination test is required, CPU 34 of device 30 may be electrically loaded (i.e., operated to consume high current) and display 32 may be illuminated (e.g., in white light with high brightness). Information regarding voltage drop during loading of device 30 may be obtained from the operation system stored in memory 38. Clock 39 may provide time stamps for each reading of voltage.

According to some embodiments, CPU 34 may be adapted to calculate the slope of the voltage drop curve based on consecutive voltage observations, and may calculate a maximal voltage change rate value. The calculated voltage change rate value (MVC) and/or the observations recorded on memory 38, may be communicated to server 40 over network 50.

According to some embodiments of the present invention, main server 40 may comprise a processor 44, a database 48 and a server communication unit 45. Processor 44 may be adapted to receive voltage drop observations and/or calculated voltage drop values such as Maximal Voltage Change (MVC) or Average Voltage Change (AVC) value from portable device 30 over network 50 and to calculate and determine the State of Health (SoH) of battery 36 based on a comparison of the received calculated voltage drop value with pre-calculated thresholds stored in database 48.

According to embodiments of the present invention, after the SoH of battery 36 has been determined, the SoH may be returned to portable device 30 via server communication unit 45.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the true spirit of the invention.

The invention claimed is:

1. A method for determining a State of Health (SoH) of a power source of a communication device, the method comprising:
    extracting, with a processor of the communication device, at least one device parameter from said communication device;
    obtaining, with the processor and from voltage files of an Operation System (OS) running on the communication device, a start voltage value of said power source and a time stamp indicative of a time said start voltage value is obtained;
    activating, with the processor, software components installed on said communication device to electrically load hardware of said communication device;
    identifying, with the processor, at least a first voltage drop relative to said start voltage value by comparing subsequent readings of the voltage files from the OS of the communication device;
    calculating, with the processor, based on the subsequent readings of the voltage files, a voltage change value of said power source;
    comparing, with the processor, said calculated voltage change value of said power source to one or more threshold values stored in a database; and
    determining, with the processor, said SoH of said power source based on said comparison of said calculated voltage change value to said one or more threshold values;
    wherein at least one of said one or more threshold values is calculated based on at least one of:
        a mean voltage drop rate of a first cluster of power sources known to have a good state of health, wherein the first cluster of the power sources has a good SoH based on SoH data for the first cluster of the power sources; and
        a mean voltage drop rate of a second cluster of power sources known to have a bad state of health, wherein the first cluster and the second cluster are determined by a clustering algorithm and the second cluster of the power sources has a bad SoH based on SoH data for the second cluster of the power sources.

2. The method according to claim 1 further comprising:
    identifying at least a second voltage drop relative to said first voltage drop by comparing consecutive readings of voltage files from the OS of the communication device;
    calculating, based on said second voltage drop and said first voltage drop a second voltage drop rate of said power source; and
    calculating said voltage change value based on a derivative of the voltage in time.

3. The method according to claim 1 wherein said hardware activated by the software components comprises one or more of a display of said communication device; a flashlight of said communication device; and a GPS of said communication device.

4. The method according to claim 1 further comprising checking that at least one prerequisite is met prior to obtaining said start voltage value.

5. The method according to claim 4 wherein said at least one prerequisite is any of: state of charge of said power source; ambient temperature and disconnection of examined power source from a charger.

6. The method according to claim 5 wherein said ambient temperature is between 10-35 Celsius degrees.

7. The method according to claim 6 wherein said state of charge is in the range of 30%-80%.

8. The method according to claim 1 wherein at least one of said threshold values is calculated based on at least one of:
- a mean voltage drop rate and standard deviation of a first cluster of power sources known to have a good state of health;
- a mean voltage drop rate and standard deviation of a second cluster of power sources known to have a bad state of health; and
- a clustering algorithm.

9. The method according to claim 8, wherein at least another of said threshold values equals said one threshold value multiplied by a coefficient.

10. The method according to claim 9, wherein said coefficient equals 1.61.

11. The method according to claim 1, wherein said at least one device parameter is any of: power source type; power source design capacity; power source model; communication device model; and manufacturer details.

12. The method according to claim 1, further comprising repeating the steps of:
- obtaining from voltage files of the OS additional start voltage values of said power source and time stamps indicative of the time said start voltage value is obtained;
- identifying, with the processor, at least additional voltage drops relative to said start voltage value;
- calculating, additional voltage change values;
- comparing, with the processor, said additional calculated voltage change values of said power source to threshold values stored in a database; and
- determining, with the processor, said State of Health of said power source based on said comparison of said additional calculated voltage change value and said threshold values.

* * * * *